United States Patent [19]
Reddy

[11] Patent Number: 5,270,974
[45] Date of Patent: Dec. 14, 1993

[54] MONOLITHIC FAIL BIT MEMORY

[75] Inventor: Chitranjan N. Reddy, Milpitas, Calif.

[73] Assignee: Alliance Semiconductor Corporation, San Jose, Calif.

[21] Appl. No.: 41,909

[22] Filed: Apr. 2, 1993

Related U.S. Application Data

[63] Continuation of Ser. No. 579,345, Sep. 7, 1990, abandoned.

[51] Int. Cl.$^5$ .............................................. G11C 29/00
[52] U.S. Cl. ................... 365/200; 365/230.03; 365/230.06; 365/230.08; 307/463; 307/465; 307/441; 307/449; 371/10.2; 371/10.3
[58] Field of Search ............... 307/465, 441, 449, 463; 365/200, 230.03, 230.06, 230.08; 371/10.2, 10.3

[56] References Cited

U.S. PATENT DOCUMENTS

| | | | |
|---|---|---|---|
| 4,757,474 | 7/1988 | Fukushi et al. | 365/200 |
| 4,817,056 | 3/1989 | Furutani et al. | 365/200 |
| 4,837,747 | 6/1989 | Dosaka et al. | 365/230.03 |
| 4,855,613 | 8/1989 | Yamada et al. | 307/441 |
| 4,867,416 | 8/1989 | Takeuchi | 371/10.3 |
| 4,905,192 | 2/1990 | Nogami et al. | 365/200 |
| 4,935,899 | 6/1990 | Morigami | 365/200 |
| 5,043,943 | 8/1991 | Crisp et al. | 365/200 |
| 5,083,894 | 1/1992 | Okajima | 365/230.03 |
| 5,113,371 | 5/1992 | Hamada | 365/200 |
| 5,660,197 | 10/1991 | Park et al. | 371/10.2 |

Primary Examiner—Joseph E. Clawson, Jr.
Attorney, Agent, or Firm—Limbach & Limbach

[57] ABSTRACT

Methods and apparatus are provided for using a partially functional memory device with extra fail bits to create a fully functional monolithic device. The concept may be expanded for use in waferscale integration. The concept may also be used to create a fully functional memory board using partially functional memory chips. To accomplish this, a distinct fail bit array is added to each memory chip and the defective bits in the main chip are replaced by bits in the fail bit array using a programmable element, such as a programmable logic array (PLA). The PLA generates fail bit access addresses to locations in the fail bit memory that replace the defective bits in the main array. Thus, the external address is simultaneously applied to both the main array and to the PLA. If there is a match between the external address and an internal location in the PLA, the PLA outputs a flag and a fail bit address which are used to disable the main array access and to enable access to the fail bit memory.

4 Claims, 5 Drawing Sheets

MONOLITHIC FAIL BIT MEMORY

This is a continuation of co-pending application Ser. No. 07/579,345 filed on Sept. 7, 1990, now abandoned.

FIELD OF THE INVENTION

The present invention relates to memory systems and, in particular, to a method and apparatus for using a partially functional memory chip with extra fail bit storage capacity to create a fully-functional monolithic memory system. The concept of the invention can be utilized in a waferscale fail bit memory system.

BACKGROUND OF THE INVENTION

As memory chip density increases, the defect density resulting from the integrated circuit fabrication process limits the functional yield. While an increasing amount of attention has been focused on controlling the fabrication process to limit defect density, as chip geometries shrink and chip size increases, it becomes increasingly difficult to control the process tightly enough to achieve high natural functional yield.

A number of techniques, such as redundancy schemes, have been utilized to increase the functional yield of memory devices. Basically, a redundancy scheme provides extra rows and/or columns in the memory array which can be used to replace defective bits, defective rows, or defective columns.

FIG. 1 shows a block diagram of a memory chip 10 with row and column redundancy. The memory array of chip 10 is subdivided into 4 quadrants (Q1-Q4) by the X row and Y column decoders. This "quadrant" type of architecture is utilized to provide increased access speed to memory cells within the array. A memory cell in memory array quadrant Q2 is accessed by simultaneously applying an X-address to row decoders 12 and a Y-address to column decoders 14 whereby a single row and a single column are selected in quadrant Q2. The cross point of the selected row and the selected column identifies the memory cell that is accessed. The data stored in that cell is then transferred onto the I/O lines where it is amplified and transferred onto an I/O bus 16.

To write into the accessed cell, X-row and Y-column addresses are applied to the row and column decoders, which in turn select a single cell to which the data to be written is transferred from I/O bus 16.

During the manufacturing of a monolithic memory device, process defects can disable a row or a column or a single bit or multiple bits, making the chip unusable. To overcome these defects, an extra row 18 and an extra column 20 are added to each of the four quadrants Q1-Q4. If there is a defect in a given quadrant, making a normal row 22 or a normal column 24 or a single bit fail, then that particular row or column or bit is disabled permanently and is replaced by the redundant row 18 or column 20 for that quadrant. Of course, those skilled in the art will appreciate that multiple redundant rows and columns can be included in each quadrant as chip size and cost permit.

The above-described redundancy approach to handling chip defects has limitations in that a redundant row can only replace a defective row or a single bit and a redundant column can only replace a defective column or a single bit. This replacement scheme rigidity, in combination with array segmentation, limits the effectiveness of the redundancy scheme and inhibits its application to waferscale integration.

SUMMARY OF THE INVENTION

The present invention provides methods and apparatus for using a partially functional memory chip with extra fail bits to create a fully functional monolithic chip which may be expanded to create a waferscale fail bit memory system. This concept may also be used to create a fully functional memory board using partially functional memory chips.

To accomplish this, fail bits are added to each memory chip and the defective bits in the main memory array of the chip are replaced by the fail bits using a programmable element, such as a programmable logic array. The programmable logic array (PLA) stores the identity of each of the defective locations in the main memory array and a corresponding fail bit access address to the fail bits replacing the defective bits in the main array. When an external address is applied to the main array, it is simultaneously applied to the PLA. If there is a match between the external address and an internal stored location in the PLA, then the PLA outputs a flag and a fail bit address which are used to disable main array access and enable access the corresponding fail bits to replace the defective bits in the main array.

A better understanding of the features and advantages of the present invention will be obtained by reference to the following detailed description and accompanying drawings which set forth an illustrative embodiment in which the principles of the invention are utilized.

DETAILED DESCRIPTION OF THE INVENTION

Figure 1:
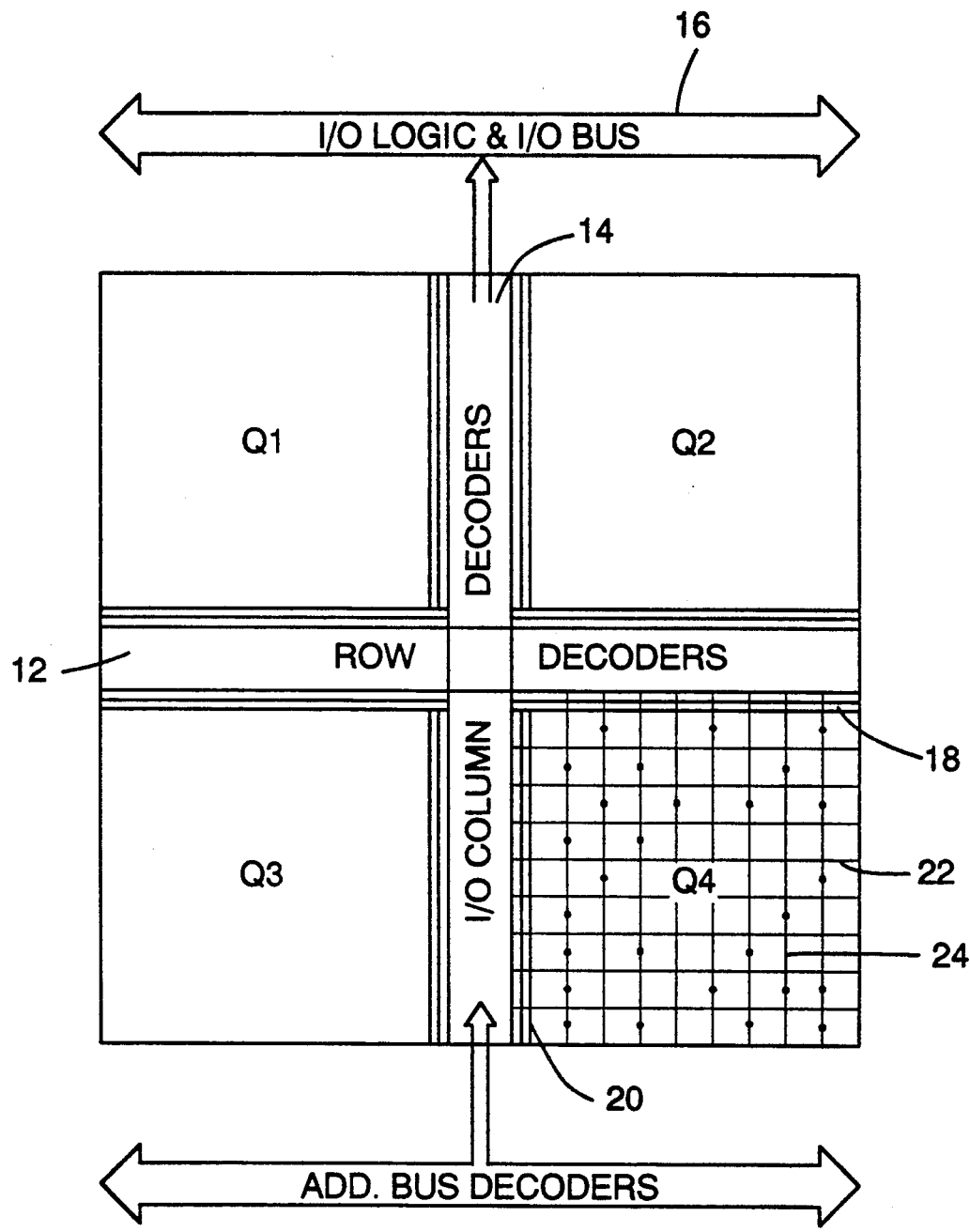
FIG. 1 is a block diagram illustrating a conventional memory device redundancy replacement scheme.
Figure 2:
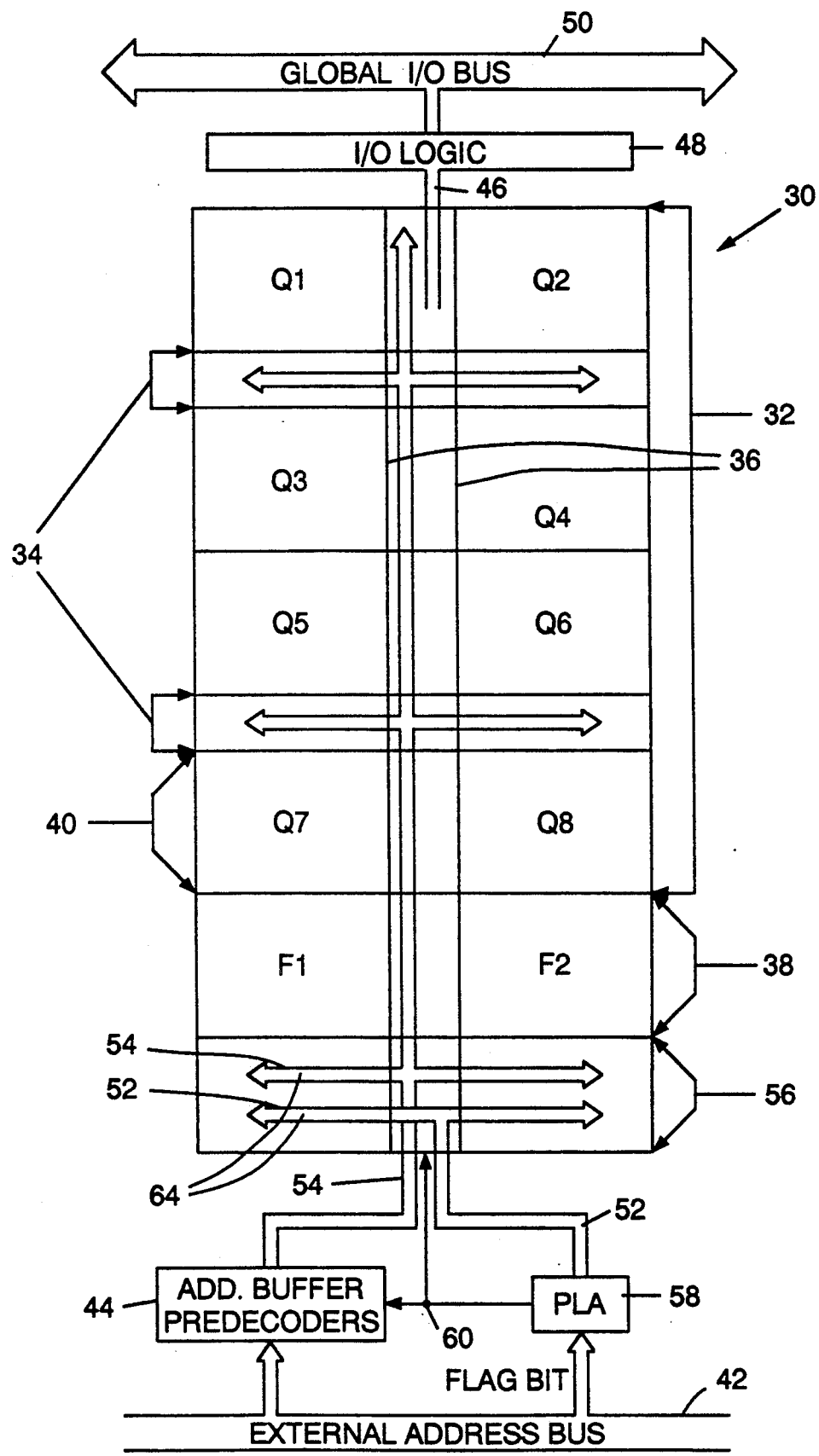
FIG. 2 is a block diagram illustrating a monolithic fail bit memory in accordance with the present invention.

FIG. 2 shows a block diagram of a monolithic fail bit memory 30 in which a main memory cell array 32 is divided into eight sectors or "quadrants" (Q1-Q8). Two sets of X-row decoders 34 and one set of Y-column decoders 36 provide access to a selected memory cell in the array 32.

Two additional memory cell sectors F1 and F2 provide a fail bit memory array 38 which is used for replacement of defective rows, columns or single bits in the main memory array 32.

The memory cells of the main memory sectors Q1-Q8 are accessed by applying an external address to address buffer and predecoder 44 via the external address bus 42. The access address is in turn used in X-row decoders 34 and Y-column decoders 36 for row and column selection within the array 32. The selected memory cell places the data stored therein onto an I/O data bus 46. The data is then decoded through I/O logic 48 onto a global I/O bus 50.

The fail bit memory 38 is accessed by the combination of a fail bit address 52 and the main chip access address 54 through fail bit decoders 56. If there is a defective memory cell (bit), or a defective row, or a defective column, in one of the sectors Q1-Q8 of the main memory array 32, then the address of the defect location is utilized by a programmable logic array (PLA) 58 to generate a corresponding fail bit address 52 and flag bit 60. The PLA 58 is programmed to replace all of the defective bits in the main memory array 32.

Thus, when an external access address is applied on the external address bus 42, it is simultaneously applied both to the address buffer and predecoder 44 of the main memory array 32 and to the PLA 58. If that particular external access address generates an enabled flag bit 60 in the PLA 58, it indicates that the main memory array 32 has a defect at that location. The enabled flag bit 60 is used to disable the normal access path of the main array 32 onto the I/O bus 46 and to enable the fail bit memory decoders 56.

As the PLA 58 generates the flag 60, it also generates the fail bit address 52 required to access the corresponding replacement bits in the fail bit memory 38 through the fail bit decoders 56, which use a combination of the fail bit address 52 and the main memory access address 54 to generate a fail bit memory access address 64. The fail bit memory access address 64 is used to access the data stored in the specified location of the fail bit memory 38 in fail bit sectors F1 and F2 and provides the contents of the accessed fail bit cell to the global I/O bus 50 via I/O logic 48.

It can be seen from the operation of the above-described circuit 30 that the failure mode of the main array sectors (rows, columns, or single bits) has no physical relationship with the fail bit sectors F1 and F2 and the defect replacement scheme. The external access address 42 of the defective row, column, or single bit in the main array 32 is always translated into a fail access address 52, thereby eliminating the rigidness of normal redundancy schemes, where rows are always replaced by rows and columns are always replaced by columns. Also, the fail bit access address 52 has no physical relationship to the sector arrangement of the main memory array 32. Thus, the number of defective bits that can be replaced in the main memory array 32 is independent of defect occurrence in a particular sector (obviously, the number of defective bits cannot exceed the size of the fail bit memory 38 itself).

Also, it is possible to eliminate the fail bit access address 52 and combine the PLA 58 and the fail bit decoders 56 into a single element as fail bit access decoders. Each of the fail bit decoders would be independently programmed with the defective bit location in the main memory array 32. When an external address is applied directly to the fail bit decoder, and if that fail bit decoder is programmed to match that particular external address combination, then it will generate a flag 60 that disables the normal access path and enables that particular location in the fail bit memory sectors F1 and F2.

Figure 3A:
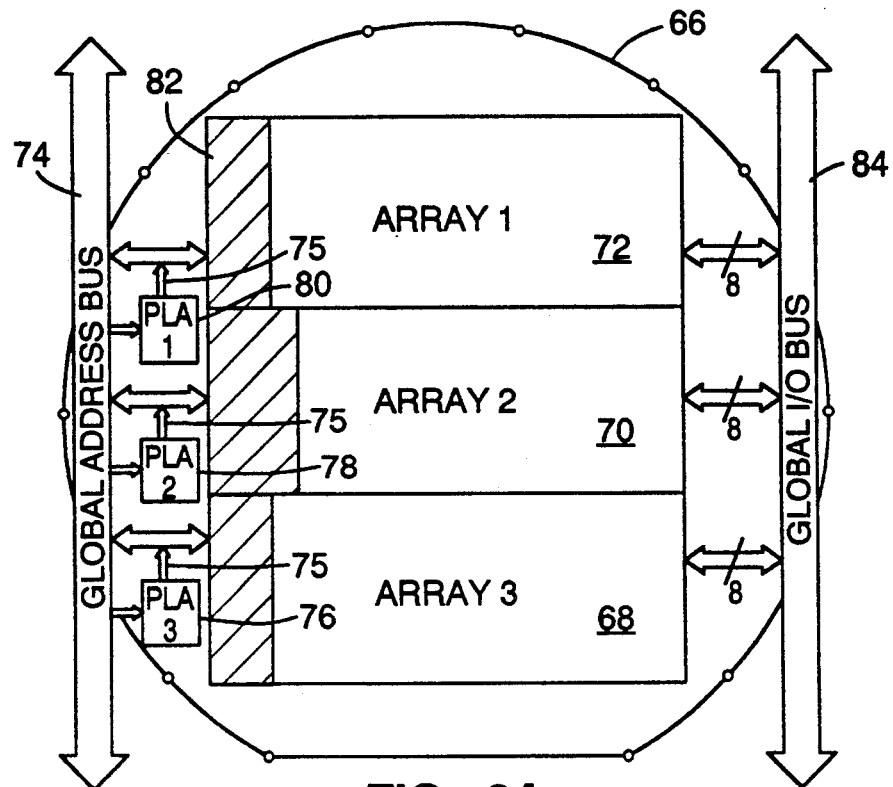
FIG. 3A is a block diagram illustrating an embodiment of a waferscale monolithic fail bit memory system in accordance with the present invention.
Figure 3B:
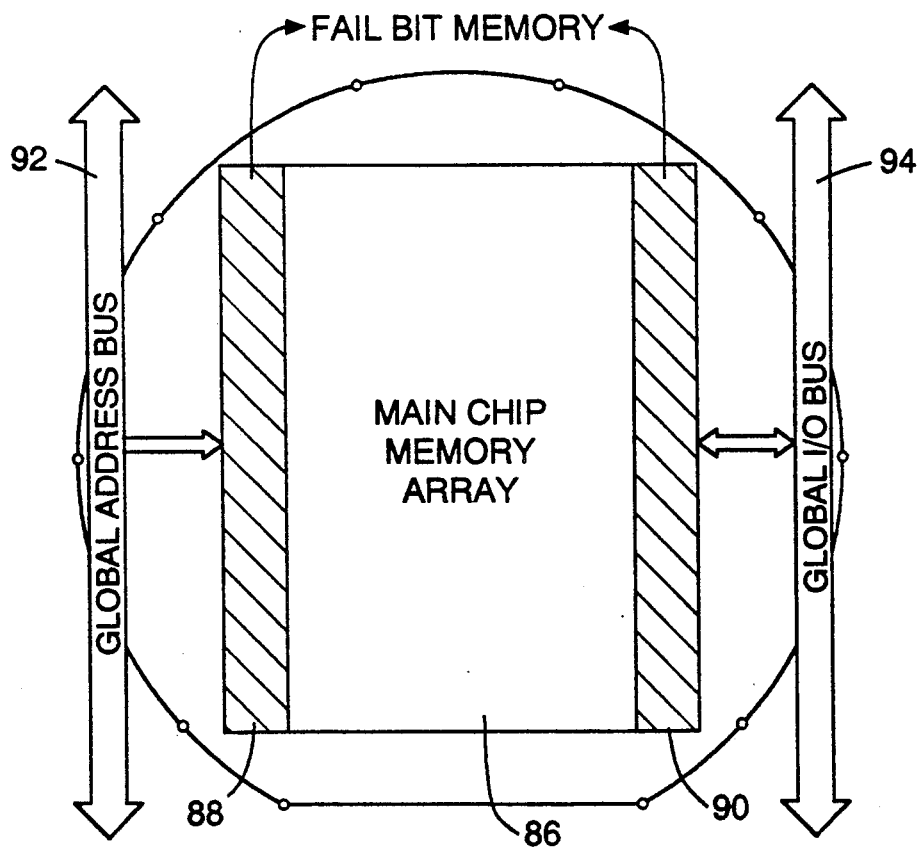
FIG. 3B is a block diagram illustrating an alternative embodiment of a waferscale monolithic fail bit memory system in accordance with the present invention.

The monolithic concept described above with respect to a single chip memory device can be extended to full waferscale integration as shown in FIGS. 3A and 3B.

FIG. 3A illustrates a wafer 66 divided into three main memory cell arrays 1, 2 and 3. Each of these arrays 1, 2 and 3 receives a global access address 74, which is provided to each of the arrays 1, 2 and 3 through a corresponding PLA 76, 78 and 80, respectively. Each of the PLAs 76, 78 and 80 provides the access address 75 to a corresponding fail bit memory 82 in each of the arrays 1, 2 and 3. The access address is then used to replace the defective bit locations in the main chip arrays 1, 2 and 3.

The fail bit memory 82 can be optimized for each of the arrays 1, 2 and 3 and data from each of the arrays transferred onto a global I/O bus 84, thereby creating full waferscale integration.

This concept is also shown in FIG. 3B where the full wafer is integrated into a single memory array 86 and fail bit memory segments 88 and 90 are added on opposing sides of the array 86 to improve the repair rate.

Figure 4:
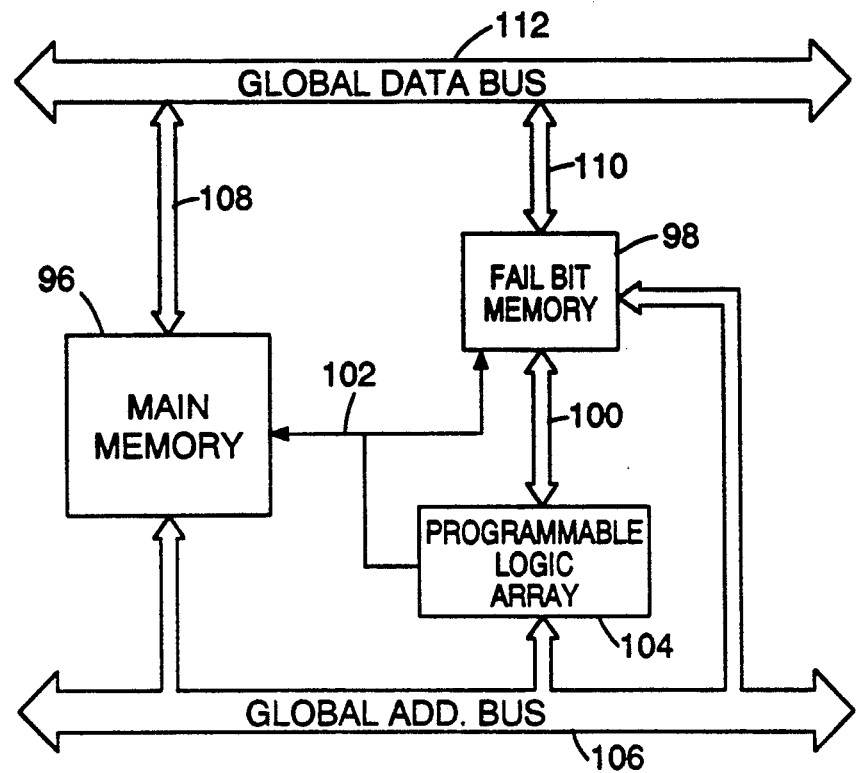
FIG. 4 is a block diagram illustrating a fail bit memory system in accordance with the present invention implemented using partially functional integrated circuit devices.

This concept can also be implemented at the discrete component level, as shown in FIG. 4. As shown in FIG. 4, a main memory 96 consists of a number of memory chips with defective bits. These defective bits are replaced by fail bit memory 98 through the fail bit access address 100 and flag bit 102. All of the main memory defective location addresses are stored in PLA 104 with the corresponding fail access address 100 and flag bit 102. When the external address on global bus 106 matches an access address in the PLA 104, then the PLA 104 outputs a fail access address 100 and a disable flag bit 102 which are used to access the fail bit memory 98 and to disable the main memory data path 108. The fail bit access address 100 in combination with the external access address on global bus 106 combine to provide access to the fail bit memory 98; the flag bit 102 is used to enable the fail bit access path 110 onto the global data bus 112.

It can be seen that in all of the above implementations of the invention, a PLA is utilized as the logic element that generates the access addresses to fail bit memory for defective locations in a main memory array. This is accomplished by translating the external address to the fail bit address in such a way that only the defective locations are stored and the rest of the main chip addresses are ignored.

Figure 5A:
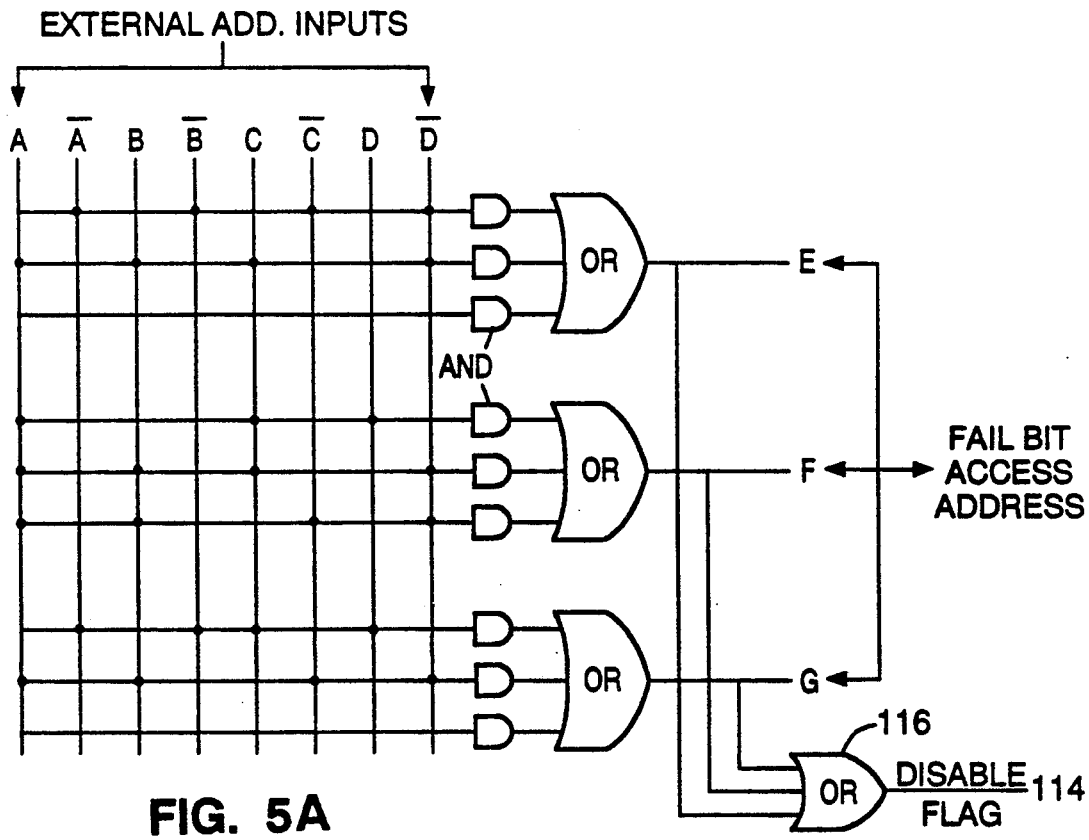
FIG. 5A is a logic diagram illustrating use of a programmable logic array for generating a fail bit memory access address in accordance with the present invention.

To assist in understanding this procedure, FIG. 5A provides an illustrative implementation of a 4 input main memory array (16 locations) which has 5 defective locations. These 5 locations are replaced by 5 replacement locations in a fail bit memory. To access these 5 replacement locations in the fail bit memory, the fail access address must be 3 bits wide.

As shown in FIG. 5A, the E, F and G output lines of the PLA correspond to the 3 bits of the fail access address. The main memory array has 4 input access address lines A, B, C and D which are also used as inputs to the PLA to generate the fail access address. Assume that the 5 defective locations in the main memory array are $\overline{A}\cdot\overline{B}\cdot\overline{C}\cdot\overline{D}$, $A\cdot B\cdot C\cdot\overline{D}$, $\overline{A}\cdot\overline{B}\cdot C\cdot D$, $A\cdot B\cdot\overline{C}\cdot\overline{D}$ and $A\cdot B\cdot C\cdot D$, and are replaced in the fail bit memory. To generate the fail bit access address for these 5 locations in the fail bit memory, the PLA is programmed as shown in FIG. 5A, where a dot indicates an AND function. Thus, PLA output line E goes high whenever a $\overline{A}\cdot\overline{B}\cdot\overline{C}\cdot\overline{D}$, $A\cdot B\cdot C\cdot\overline{D}$ combination is applied to the PLA input. The main memory defect locations are thus translated to the fail bit access address as follows:

| | E | F | G |
|---|---|---|---|
| A̅ B̅ C̅ D̅ | 1 | 0 | 0 |
| A B̅ C D | 0 | 1 | 0 |
| A B C D̅ | 0 | 0 | 1 |
| A B C̅ D̅ | 1 | 1 | 0 |
| A B C D̅ | 0 | 1 | 1 |

These fail bit access addresses are again decoded to access the fail bit array and are also used to generate a disable flag 114 using an "OR" function 116, which disables the main memory access path.

Figure 5B:
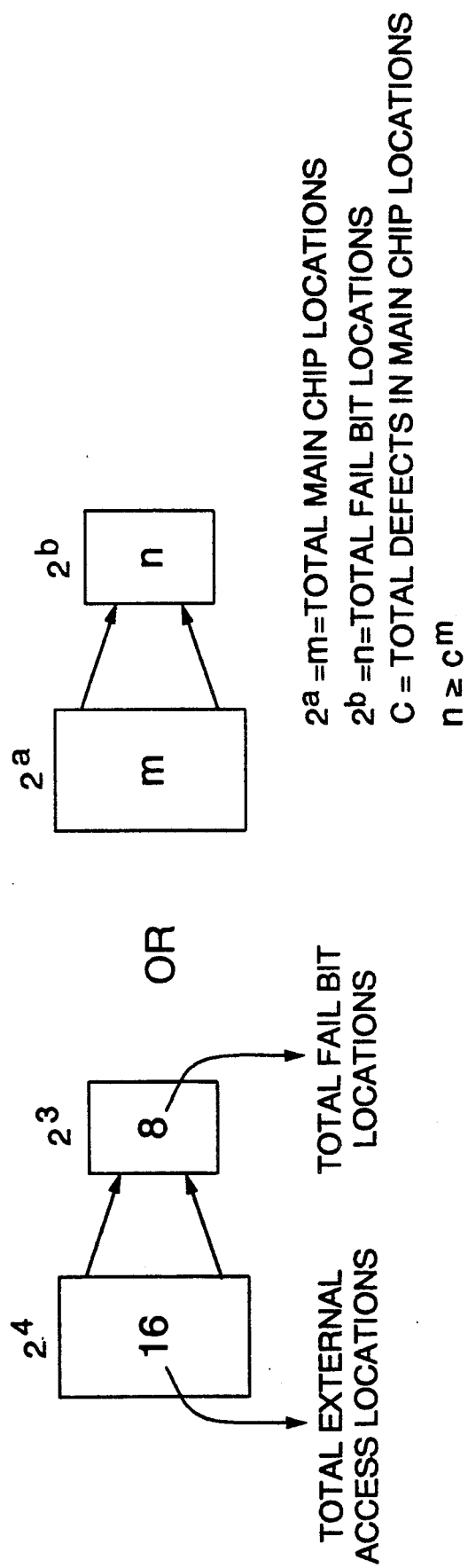
FIG. 5B is block diagram illustrating the relationship between total fixable defects in a main memory array and a fail bit access address.

FIG. 5B illustrates the relationship between the maximum number of defective bits that can be replaced in the main memory array and the number of fail bit access addresses that must be generated to access the fail bit locations. This implementation of the PLA can be accomplished with the use of a laser fuse or by using other non-volatile storage elements.

It should be understood that various alternatives to the embodiments of the invention described herein may be employed in practicing the invention. It is intended that the following claims define the scope of the invention and that methods and apparatus within the scope of these claims and their equivalents be covered thereby.

What is claimed is:

1. An integrated circuit fail bit memory system comprising:
    an external address bus for providing an external address;
    a system data bus;
    a main memory array that includes a plurality of main memory storage locations for storing binary data, the main memory storage locations being arranged in an x-y matrix that includes rows of main memory storage locations arranged in an x-direction and columns of main memory storage locations arranged in a y-direction such that each main memory storage location responds to a corresponding decoded main memory access address having an x-direction component ($x_o$-$x_n$) and a y-direction component ($y_o$-$y_n$) by providing binary data stored in said main memory storage location to the system data bus via a main memory data path connected between the main memory array and the system data bus, the main memory array including main memory storage locations identified as being defective;
    a main memory decoder connected to receive external addresses form the external address bus and that responds to an external address by providing a corresponding decoded main memory access address;
    a fail bit address decoder connected to receive external addresses from the external address bus and that responds to an external address that causes the main memory decoder to provide a decoded main memory access address corresponding to a defective main memory storage location (1) by providing a first component of a fail bit memory access address and (2) by asserting a flag signal to the main memory data path that disables the main memory data path such that binary information stored in said defective main memory storage location is not transferred to the system data bus;
    a fail bit data path connected to the system data bus and to receive the flag signal and that responds to the asserted flag signal by enabling binary data to be provided to the system data bus via the fail bit data path;
    a fail bit memory array connected to the system data bus via the fail bit data path and that includes a plurality of fail bit memory storage locations for storing binary data that corresponds to the binary data stored in defective main memory storage locations, the fail bit memory storage locations being arranged in an x-y matrix that includes rows of fail bit memory locations arranged in the x-direction and columns of main memory storage locations arranged in the y-direction such that each fail bit memory storage location responds to a corresponding fail bit memory access address that includes the first component provided by the fail bit address decoder and a second component derived from the main memory access address by providing binary data stored in said fail bit memory storage location to the system data bus via the fail bit data path.

2. An integrated circuit fail bit memory system as in claim 1 wherein the fail bit address decoder comprises a programmable logic array (PLA) that responds to an external address received at PLA inputs, said external address causing the main memory decoder to provide a decoded main memory access address corresponding to a defective main memory storage location, by providing both the first component of the fail bit memory access address and the asserted flag signal at PLA outputs.

3. A fail bit memory system for replacing defective memory storage locations in a memory system that includes the fail bit memory system and a main memory system, and wherein the main memory system includes a main memory array having a plurality of main memory storage locations, and wherein each main memory storage location responds to a decoded main memory access address by providing binary data stored in said main memory storage location to a system data bus via a main memory data path connected between the main memory array and the system data bus, the main memory system further including a main memory decoder that responds to an external address provided to the main memory decoder via an external address bus by providing a corresponding decoded main memory access address, the main memory array including main memory storage locations identified as being defective, the fail bit memory system comprising:
    a fail bit address decoder connected to receive external addresses from the external bus and responsive to an external address that causes the main memory decoder to provide a decoded main memory access address that corresponds to a main memory storage location identified as being defective by providing a first fail bit memory access address portion that corresponds to said external address and by asserting an active flag logic signal, wherein the active flag logic signal disable the main memory data path;
    a fail bit data path connected to the system data bus, wherein the active flag logic signal enables the fail bit data path; and
    a fail bit memory array connected to the system data bus via the fail bit data path and including a plurality of fail bit memory storage locations, and wherein the fail bit memory storage locations store fail bit data corresponding to the binary data stored in corresponding main memory storage locations identified as being defective, and wherein the fail bit memory array responds to a fail bit memory access address that includes the first fail bit memory access address portion provided by the fail bit address decoder and a second fail bit memory access address portion derived from said decoded main memory access address by transferring the fail bit information stored in a fail bit memory storage location corresponding to said fail bit memory access address to the system data bus via the enabled fail bit data path.

4. An integrated circuit fail bit memory system comprising:

an external address bus for providing an external address;

a system data bus;

a main memory array that includes a plurality of main memory storage locations arranged in a main memory matrix that includes a plurality of main memory rows and a plurality of main memory columns such that each main memory storage location is identifiable by the intersection of a specified main memory row and a specified main memory column, and wherein each main memory storage location responds to a corresponding decoded main memory row address and a corresponding main memory column address by providing information stored in said main memory storage location to the system data bus via a main memory data path connected between the main memory array and the system data bus, the main memory array including main memory storage locations identified as being defective;

a main memory row decoder that responds to said external address by providing a corresponding decoded main memory row address;

a main memory column decoder that responds to said external address by providing a corresponding decoded main memory column address;

a fail bit address decoder that responds to an external address having a corresponding decoded main memory access address that corresponds to a main memory storage location identified as being defective by providing both a first fail bit memory access address portion that corresponds to said external address and an active flag logic signal, wherein the active flag logic signal disables the main memory data path;

a fail bit data path connected to the system data bus, and wherein the active flag logic signal enables the fail bit data path; and a fail bit memory array connected to the system data bus via the fail bit data path and having a plurality of fail bit memory storage locations, and wherein the fail bit memory storage locations store fail bit information corresponding to the information stored in a corresponding main memory storage location identified as being defective, and wherein the fail bit memory array responds to a fail bit memory access address that includes said first fail bit memory access address portion and a second fail bit memory access address portion derived from said main memory access address corresponding to said external address by providing fail bit information stored in a fail bit memory storage location corresponding to said fail bit memory access address to the system data bus via the fail bit data path.

* * * * *